United States Patent
Brewer et al.

(10) Patent No.: US 6,475,942 B1
(45) Date of Patent: Nov. 5, 2002

(54) CONVERSION OF POLYCRYSTALLINE ALUMINA TO SINGLE CRYSTAL SAPPHIRE USING MOLYBDENUM DOPING

(75) Inventors: James Anthony Brewer, Scotia; Charles David Greskovich, Niskayuna, both of NY (US); Curtis Edward Scott, Mentor, OH (US)

(73) Assignee: General Electric Company, Niskayuna, NY (US)

( * ) Notice: Subject to any disclaimer, the term of this patent is extended or adjusted under 35 U.S.C. 154(b) by 53 days.

(21) Appl. No.: 09/655,150

(22) Filed: Sep. 5, 2000

(51) Int. Cl.[7] .................. L30B 29/20; C04B 35/10; C30B 29/32
(52) U.S. Cl. ............... 501/153; 501/86; 117/2; 117/7; 117/949
(58) Field of Search .................. 501/153, 86, 127; 117/2, 3, 4, 7, 949

(56) References Cited

U.S. PATENT DOCUMENTS

| | | | |
|---|---|---|---|
| 3,980,438 A | * 9/1976 | Castonguay et al. | 313/636 |
| 4,285,732 A | * 8/1981 | Charles et al. | 501/101 |
| 4,900,393 A | 2/1990 | Kugimiya et al. | |
| 5,427,051 A | * 6/1995 | Maxwell et al. | 117/3 |
| 5,451,553 A | * 9/1995 | Scott et al. | 117/4 |
| 5,487,353 A | * 1/1996 | Scott et al. | 117/1 |
| 5,540,182 A | 7/1996 | Levinson et al. | |
| 5,545,495 A | * 8/1996 | Kato | 429/320 |
| 5,549,746 A | 8/1996 | Scott et al. | |
| 5,588,992 A | 12/1996 | Scott et al. | |
| 5,683,949 A | * 11/1997 | Scott et al. | 117/2 |
| 5,690,734 A | * 11/1997 | Imaeda et al. | 117/4 |
| 5,916,363 A | * 6/1999 | Fujji et al. | 117/10 |
| 6,214,427 B1 | * 4/2001 | Levinson | 117/4 |
| 6,299,681 B1 | * 10/2001 | Azad et al. | 117/10 |

* cited by examiner

Primary Examiner—Tom Dunn
Assistant Examiner—Colleen P. Cooke
(74) Attorney, Agent, or Firm—Robert P. Santandrea; Noreen C. Johnson (57) ABSTRACT

A process for converting a polycrystalline ceramic material to a single crystal material includes the steps of doping at least a first portion of the polycrystalline ceramic material with a conversion-enhancing dopant having a +6 valence state in the unfired ceramic material and heating the polycrystalline ceramic material to convert at least a second portion of the polycrystalline ceramic material to a single crystal ceramic material. Preferably, the ceramic material is alumina and the conversion-enhancing dopant is molybdenum or tungsten.

26 Claims, 6 Drawing Sheets fig. 1A				fig. 1B fig. 2A fig. 2B fig. 3 fig. 4        fig. 5 fig. 6 fig. 7 fig. 8

CONVERSION OF POLYCRYSTALLINE ALUMINA TO SINGLE CRYSTAL SAPPHIRE USING MOLYBDENUM DOPING

This invention was funded by the U.S. Air Force Office of Scientific Research Contract No. F49620-98-C-0002. The U.S. government may have certain rights in this invention.

BACKGROUND OF THE INVENTION

This invention relates generally to conversion of a polycrystalline ceramic body to a single crystal body and specifically to conversion of polycrystalline alumina to single crystal sapphire by doping the alumina with molybdenum or tungsten.

Molybdenum is known as an undesirable trace impurity in melt grown single crystal alumina (sapphire). Molybdenum particles can become entrapped in the sapphire boule and act as defects which deteriorate the optical properties of the sapphire. Therefore, one of ordinary skill in the art would avoid introducing molybdenum into melt grown sapphire.

Sapphire may also be produced by solid state conversion of polycrystalline alumina. A sapphire or single crystal alumina material is defined as a portion of material having one crystal greater than or equal to one centimeter in size in any direction (i.e., a circle having a diameter of $\geq 1$ cm or an elongated crystal having a length of $\geq 1$ cm). Solid state conversion of polycrystalline alumina ("PCA") to single crystal alumina by doping the alumina body with certain conversion (i.e., recrystallization) promoting dopants and then heating the doped alumina body to temperatures between 1100 and 2050° C. is disclosed in U.S. Pat. No. 5,588,992 ("the '992 patent"), which is a divisional of U.S. Pat. No. 5,487,353, both incorporated herein by reference in their entirety. The '992patent' discloses that the conversion promoting dopants comprise elements such as chromium, gallium, titanium, cerium and vanadium, which assume the +3 valence state in alumina.

While the +3 valence state dopants are acceptable for promoting the conversion of polycrystalline alumina to sapphire, it still requires about 9 hours to completely convert a 5 mm diameter Cr-doped PCA tube to sapphire. As discussed in the U.S. Pat. No. 5,588,992, the conversion rate from PCA to sapphire increases as the concentration of the dopant, such as chromium, is increased. However, if chromium is present in a very high concentration in the PCA, then the PCA is converted to ruby rather than sapphire. Since ruby has a pink color and luminesces in the red spectral range, a ruby lamp arc tube may not be as desirable as a clear lamp arc tube for certain lamp applications.

The present inventors have determined that it would be desirable to improve the reproducibility and speed of the conversion process, as well as to reduce the cost of the process and the amount of dopants required to promote or enhance the conversion. The present invention is directed towards improving the conversion of a polycrystalline ceramic material to a single crystal ceramic material and to a single crystal ceramic material made by the improved conversion process.

BRIEF SUMMARY OF THE INVENTION

In accordance with one aspect of the present invention, there is provided a process for converting a polycrystalline ceramic material to a single crystal material, comprising doping at least a first portion of the polycrystalline ceramic material with a conversion-enhancing dopant having a +6 valence state in the unfired ceramic material, and then heating the polycrystalline ceramic material to convert at least a second portion of the polycrystalline ceramic material to a single crystal ceramic material.

In accordance with another aspect of the present invention, there is provided a process for converting polycrystalline alumina to sapphire, comprising immersing at least a first portion of a polycrystalline bisque-fired alumina body containing at least 150 parts per million (ppm) of magnesium oxide in a liquid solution containing molybdenum in a concentration equal to or greater than 5 ppm and allowing the molybdenum to penetrate into said alumina body, sintering the alumina body, decreasing the concentration of magnesium oxide in the sintered alumina body to a concentration of 60 ppm or less and heating the sintered alumina body to a temperature above one-half of a melting temperature of alumina but below the melting temperature of alumina to convert at least the first portion of the sintered alumina body to single crystal sapphire.

In accordance with another aspect of the present invention, there is provided a ceramic material body comprising at least a first single crystal sapphire portion containing a first concentration of molybdenum or tungsten sufficient to enhance the conversion of polycrystalline alumina to the single crystal sapphire.

DETAILED DESCRIPTION OF THE INVENTION

The present inventors have discovered that by replacing the prior art conversion-enhancing dopant having a +3 valence state in the ceramic material (i.e., chromium, gallium, titanium, etc. in alumina) with a conversion-enhancing dopant having a +6 valence state in the unfired ceramic material (i.e., molybdenum or tungsten in alumina), the conversion speed and reproducibility can be improved and the cost and amount of the dopant needed to enhance the conversion of a polycrystalline ceramic material to a single crystal ceramic material can be reduced. A sapphire or single crystal ceramic material is defined as a portion of material having one crystal greater than one centimeter in size in at least one direction, or alternatively, as a one centimeter or greater length of material containing a single crystal or grain where each unit cell has the same orientation (i.e., a one centimeter length of material which contains no grain boundaries).

As used herein, "conversion-enhancing dopant" refers to a dopant that, when introduced into the polycrystalline ceramic material at a sufficient concentration, either results in a solid state conversion of the polycrystalline ceramic material to a single crystal ceramic material at a rate of practical significance or reduces the time necessary to effect the conversion during a heating process. "Solid state conversion" refers to a process in which the conversion of the polycrystalline ceramic material to a single crystal ceramic material occurs at a temperature below the melting temperature of the ceramic material. "Practical significance," as used herein, refers to conversion rates on the order of centimeters per hour, which provide sufficient efficiency to make the production of single crystal with the dopant commercially feasible.

In a preferred embodiment of the present invention, the polycrystalline ceramic material comprises polycrystalline alumina and the single crystal ceramic material comprises sapphire (i.e., single crystal alumina). The preferred conversion-enhancing dopant for alumina is molybdenum or tungsten.

Advantageously, the ceramic material is doped with the conversion-enhancing material to a concentration that is sufficient to enhance the conversion of polycrystalline material to single crystal material. For example, the concentration of molybdenum in alumina preferably comprises $\geq 30$ ppm, preferably $\geq 30$ ppm but $\leq 60$ ppm. However, molybdenum concentration greater than 60 ppm may also be used in order to improve the surface texture of the single crystal material. The molybdenum dopant may be substituted with tungsten, if desired. An alumina body, which is not intentionally doped with molybdenum, contains a background or unavoidable level of molybdenum of less than 4 ppm throughout its thickness, as determined by the Inductively Coupled Plasma (ICP) analytical method.

Doping of the polycrystalline ceramic material can be accomplished in several ways. According to one preferred aspect of the present invention, the dopant may be introduced into the raw materials used to produce the polycrystalline ceramic material. For example, molybdenum, tungsten or compounds thereof may be introduced into the starting powder that will be subsequently processed into a polycrystalline alumina body.

In an alternative preferred aspect of the present invention, a bisque-fired body (i.e., a body that was annealed at a low temperature to remove the organic binders from the green ceramics) of the polycrystalline ceramic material may be immersed in a liquid doping solution containing the conversion-enhancing dopant to allow the doping solution to infiltrate the bisque-fired body. Infiltration of the doping solution into the bisque-fired body is accelerated by exposing the immersed bisque-fired body to a vacuum. For example, a bisque-fired alumina body (i.e., a relatively pure PCA body having an interconnected pore structure that is produced from a starting powder) is immersed into a molybdenum doping solution in a vacuum chamber and a vacuum is drawn in the vacuum chamber for a selected time. Alternatively, the doping solution may be poured or sprinkled onto the bisque-fired body.

The doped polycrystalline ceramic material body is heated after the doping step to convert (i.e., recrystallize) the polycrystalline material to a single crystal material. For example, the heating or annealing step of the doped alumina bisque-fired body preferably serves three functions. First, the heating step sinters the porous bisque-fired alumina body to form a dense, sintered polycrystalline alumina body. Second, the heating step removes a portion of conversion-impeding additive, such as magnesium oxide, which is used to enhance the densification of alumina, from the sintered alumina body. Third, the heating step converts the sintered polycrystalline alumina to sapphire (i.e., single crystal alumina). The heating step may comprise a single heating process in which the alumina body is raised to a temperature between 50 and 100% of its melting temperature and maintained at that temperature for a selected time, preferably 1–10 hours. Alternatively, the heating step may comprise separate heating cycles for sintering, removing the conversion-impeding additives, and converting the polycrystalline alumina to sapphire.

In a preferred aspect of the present invention, the conversion-enhancing dopant is dispersed homogeneously throughout the entire body of the polycrystalline ceramic material. After the heating step, the entire body is then converted to a single crystal ceramic material.

In an alternative preferred aspect of the present invention, the conversion-enhancing dopant is dispersed inhomogeneously in selected portion(s) of the polycrystalline ceramic material. After undergoing a heat treatment, the resulting heat-treated body is a composite material having polycrystalline and single crystal portions. In this aspect of the present invention, the polycrystalline ceramic body is inhomogeneously doped so as to have a first portion doped with the conversion-enhancing dopant to a selected concentration. A third portion of the polycrystalline body is not doped. The heating of the inhomogeneously doped body produces a composite material body in which a second portion, which comprises the first portion and/or the second portion adjacent to the first portion, contains a single crystal structure and the third portion comprises a polycrystalline structure.

Sapphire produced according to the process of this invention is distinguished from sapphire fabricated according to the prior art processes in that it contains molybdenum or tungsten in a concentration sufficient to enhance the conversion of the PCA to sapphire. Preferably, the sapphire lacks the conversion promoting dopants which assume the +3 valence state in alumina or sapphire, such as Cr, Ga, Ti or V, above the background or unavoidable concentration. However, one or more of these dopants may also be added if desired.

The surface topography of the sapphire thus produced has the form of slight undulations according to the location of PCA grains before the conversion. Specifically, the slight undulations have high points at approximately the midpoint of each PCA grain and depressions corresponding to the location of the grain boundary grooves.

A method of converting a polycrystalline ceramic material to a single crystal ceramic material according to a preferred embodiment of the present invention will now be described in detail. According to the preferred embodiment of the present invention, the polycrystalline ceramic material comprises polycrystalline alumina and the single crystal ceramic material comprises sapphire.

The preferred starting material is a bisque-fired body of relatively pure alpha alumina, for example comprising 99.98% alumina and having an interconnected pore structure. An interconnected pore structure facilitates uniform penetration of the doping solution throughout the bisque-fired body. The typical starting bisque-fired material has a pore volume ranging from about 15 to about 70%.

According to one aspect of the preferred embodiment of the present invention, the bisque-fired PCA body may be doped by immersing it in a liquid solution of the conversion-enhancing dopant. For example, the bisque-fired PCA body may be immersed into a molybdenum dopant solution, such as a molybdic acid solution, $H_2MoO_4 * H_2O$, or ammonium dimolybdate, $(NH_4)_2Mo_2O_7$. The doping solution typically comprises deionized water with dopant dissolved therein to provide a predetermined concentration of the doping ion. Infiltration of the dopant into the bisque-fired material is preferably further induced, for example, by disposing the bisque-fired material, along with the doping solution in which it is immersed, in a vacuum chamber and drawing a selected vacuum on the chamber for a selected time. Alternatively, the doping solution may be poured or sprinkled onto the bisque-fired body.

Preferably, the doping solution contains a sufficient dopant ion concentration that will be sufficient to promote or enhance the conversion of the PCA to sapphire. For example, it is desirable that the doping solution contain at least 5 ppm Mo by weight, preferably 5–11 wppm Mo, in order to obtain a Mo concentration in alumina of at least 30 wppm, preferably 30–60 wppm, respectively. However, the doping solution may contain more than 11 wppm of the dopant ion. For example, the solution may contain a Mo ion concentration of at least 100 wppm, preferably 150 wppm, in order to improve the surface texture of the resulting sapphire. Similar concentrations may be used for the tungsten dopant.

After immersion (and the exposure to the vacuum chamber, if desired) the doped bisque-fired material is removed and allowed to dry, typically in air, after which it is ready for heating in a furnace to effect the solid state conversion process to a single crystal material in a one, two or three step heating process.

The heating process will now be described in more detail. The first heating step preferably comprises a sintering step. The doped bisque-fired alumina body is preferably sintered (i.e., the first heating step) to densities greater than 3.90 g/cc after the doping step. The preferred sintering parameters are a temperature of 1740 to 1950° C. and a duration of 1 to 6 hours. Upon sintering, the bisque-fired body is converted to a dense, sintered PCA material having an equiaxed grain structure with average grain sizes less than 100 microns and preferably less than 70 microns. As used herein, grain size is the average dimension of a grain size distribution measured by the well-known linear intercept technique described in ASTM E112-88. PCA materials with average grain sizes larger than 100 microns are not preferred because they tend to form micro-cracks during the heat treatment, which hinder the conversion of the PCA to sapphire. The density of the sintered PCA is preferably at least 3.90 g/cc and more preferably greater than 3.97 g/cc in order to decrease the porosity which may impede the conversion to sapphire and/or yield a sapphire product having less than optimal light transmittance.

The bisque-fired alumina starting material according to a preferred aspect of the present invention may be used to form sapphire Lucalox™ arc tubes for high pressure sodium arc discharge lamps ("HPS lamps"), which have outer diameters ranging from 4.5 mm to 8.8 mm and wall thicknesses ranging from 0.5 mm to 0.75 mm. This bisque-fired material is available from General Electric Company, Willoughby Quartz and Ceramic Plant, Willoughby, Ohio (Product #LT5.5-36-PS; Resource #258 23 61). This bisque-fired material typically has a pore volume of 50–60%. When sintered, this material produces a PCA body having densities ranging from 3.97 g/cc to 3.98 g/cc and an equiaxed grain structure with average grain sizes ranging from 15 to 70 microns.

As discussed in Table 1 in column 5 of the '992 patent', the undoped Lucalox™ tubes may contain up to 10 ppm of background molybdenum on their surface because the tubes are in contact with molybdenum setters in the furnace. However, the undoped Lucalox™ tubes contain less than 4 ppm of molybdenum dopant in their bulk (i.e., throughout their thickness), as determined by the ICP analytical method. The 10 ppm of molybdenum contained only on the surface of the tubes is insufficient to enhance the conversion of PCA to sapphire. In contrast, the intentional doping of the PCA tubes with molybdenum such that the bulk of the tubes contain at least about 30 wppm of molybdenum (i.e., the tubes containing at least about 30 wppm of molybdenum throughout their thickness) enhances the conversion of the PCA tubes to sapphire.

Magnesium oxide is preferably added to the bisque-fired alumina as a sintering aid in a concentration of at least 150 wppm, preferably at least 300 wppm (which corresponds to magnesium concentration of at least 180 wppm), to obtain a PCA body of densities greater than 3.97 g/cc. However, MgO has been found to hinder the conversion of PCA to sapphire if present in excess quantity. Thus, steps should preferably be taken to lower the MgO content of the fully dense (i.e., sintered) doped PCA body after sintering but before conversion of the PCA body to sapphire. The level to which MgO should be lowered can depend on the amount of the conversion-enhancing dopant added. In some cases it has been found that it is preferable to reduce the MgO concentration to below 60 ppm, preferably as low as 50 ppm prior to converting the material to sapphire.

Magnesium oxide concentration in PCA may be reduced to levels which do not hinder the conversion of PCA to sapphire by heating (i.e., the second heating step) the PCA body in a vacuum, dry hydrogen, or an inert gas containing atmosphere to temperatures above 1600° C. to drive the magnesium oxide out of the PCA body. The present inventors have discovered that magnesium oxide may be driven out of molybdenum doped PCA at a greater rate than from chromium doped PCA described in U.S. Pat. No 5,588,992.

The sintered ceramic material, such as the PCA body, doped with the conversion-enhancing dopant, such as Mo or W, is then heated (i.e., the third heating step) to convert the body to a single crystal ceramic material, such as a sapphire body. Preferably, the heating temperature is not greater than the melting point of the material comprising the ceramic body but greater than one-half the melting point of the material comprising the ceramic body. For ceramic bodies comprising alumina as described herein, the PCA body is preferably heated to a temperature greater than 1100° C. but less than 2050° C., the melting point of alumina. No bulk melting of the ceramic is observed during the process of converting the PCA to sapphire, and growth of the single crystal structure is typically initiated from more than one site on the body.

The conversion-enhancing dopants described in U.S. Pat. No. 5,588,992 comprise cations having a +3 valence (i.e., Cr in alumina), contained in the alumina in a high concentration. For example, a chromium nitrate solution containing 120 ppm of Cr ions was used to dope the PCA body with 300 ppm of Cr.

However, the present inventors have discovered that by using conversion-enhancing dopants comprising cations having a +6 valence in the host ceramic material, such as Mo and/or W, the concentration of these dopants can be significantly reduced. For example a concentration of Mo dopant in PCA to sufficiently enhance the conversion of PCA to sapphire is at least about 30 ppm, preferably 30–60 ppm. Furthermore, as discussed in more detail in the specific examples below, Mo doping reduces the PCA to sapphire conversion time, and thus reduces the cost of the conversion process, even when the Mo concentration is significantly lower than the Cr concentration described in U.S. Pat. No. 5,588,992. Tungsten doping produces similar beneficial results.

According to the preferred embodiment of the present invention, the starting ceramic material (i.e., the bisque-fired alumina) is doped with molybdenum and/or tungsten prior to any heating steps. However, while not preferred, the starting ceramic material may instead be doped after the sintering or the MgO removal steps. Alternatively, the dopant may be incorporated into the starting powder that is subsequently formed into a solid body, such as the bisque fired alumina body.

As described above, fabrication of sapphire from the doped, bisque-fired alumina according to the preferred embodiment of the present invention involves three basic stages or annealing steps. The first stage is sintering the porous bisque-fired alumina material to achieve a dense PCA body (i.e., densities greater than 3.90 g/cc). The second stage is reducing the magnesium oxide concentration (magnesium oxide being a conversion-impeding additive) in the sintered PCA body below a level that impedes conversion of the PCA to single crystal sapphire. The third stage is heating the body to convert the PCA to a single crystal sapphire.

In one preferred aspect of this invention, the three stages or annealing steps are accomplished in multiple heating cycles (that is, raising the temperature of the polycrystalline material in separate processes). The three stages can be accomplished in three respective heating cycles, or alternatively in three or more heating cycles.

In another preferred aspect of the present invention, the three stages are accomplished in a single continuous heating cycle in which all three stages occur without removal of the doped polycrystalline body from the furnace used for the heating. Thus, there is no clear distinction between the occurrence of the three stages in the single heating process.

In one preferred aspect of the present invention, the conversion-enhancing dopant, such as molybdenum or tungsten, is dispersed homogeneously throughout the polycrystalline ceramic material body, such as the bisque-fired alumina body. After the heating steps described above, the entire polycrystalline ceramic body is converted to single crystal ceramic material, such as sapphire.

In an alternative preferred aspect of the present invention, variations of the process of the present invention can also be used to make a composite material, that is, a body having both single crystal structure and polycrystalline structure regions. Such a composite body may be formed by selectively doping portions of a polycrystalline bisque-fired ceramic material and then heating the material as described above to convert the doped portions of the polycrystalline material to single crystal material. For example, a spiral design may be formed down the length of a bisque-fired alumina tube by applying the molybdenum containing solution in a spiral pattern along the tube and then heat treating the tube. Following the heat treatment, the first tube portion where the doping solution is applied (as well as the neighboring second portion(s)) are converted into sapphire and have a very light gray color, while the third portion of the tube away from the first area remains polycrystalline.

The solid state conversion process in accordance with the preferred aspects of the present invention allows for simple or complex ceramic shapes to be fabricated using standard polycrystalline forming techniques and then converted into a single crystal body without melting the body. Thus, the single crystal body maintains the shape of the polycrystalline precursor, enabling the fabrication of a great diversity of shapes that are not commercially feasible to fabricate using conventional melt drawing or floating zone techniques.

The ceramic material body comprising or consisting entirely of a single crystal material, such as sapphire (i.e., an alumina body containing a region of sapphire or consisting entirely of sapphire), may be used in many different applications. The ceramic material body may comprise, for example, a fiber (as might be used in fiber reinforced material), a substrate (for electronic and mechanical applications, such as for use as a solid state or a semiconductor device substrate), a tube (such as an arc tube for HPS lamps) or other shapes. Sapphire tubes typically exhibit superior light transmittance characteristics (both total transmittance and forward diffuse transmittance), resulting in increases in lamp efficiency of about 10–15% over prior art PCA arc tubes.

Figure 8:
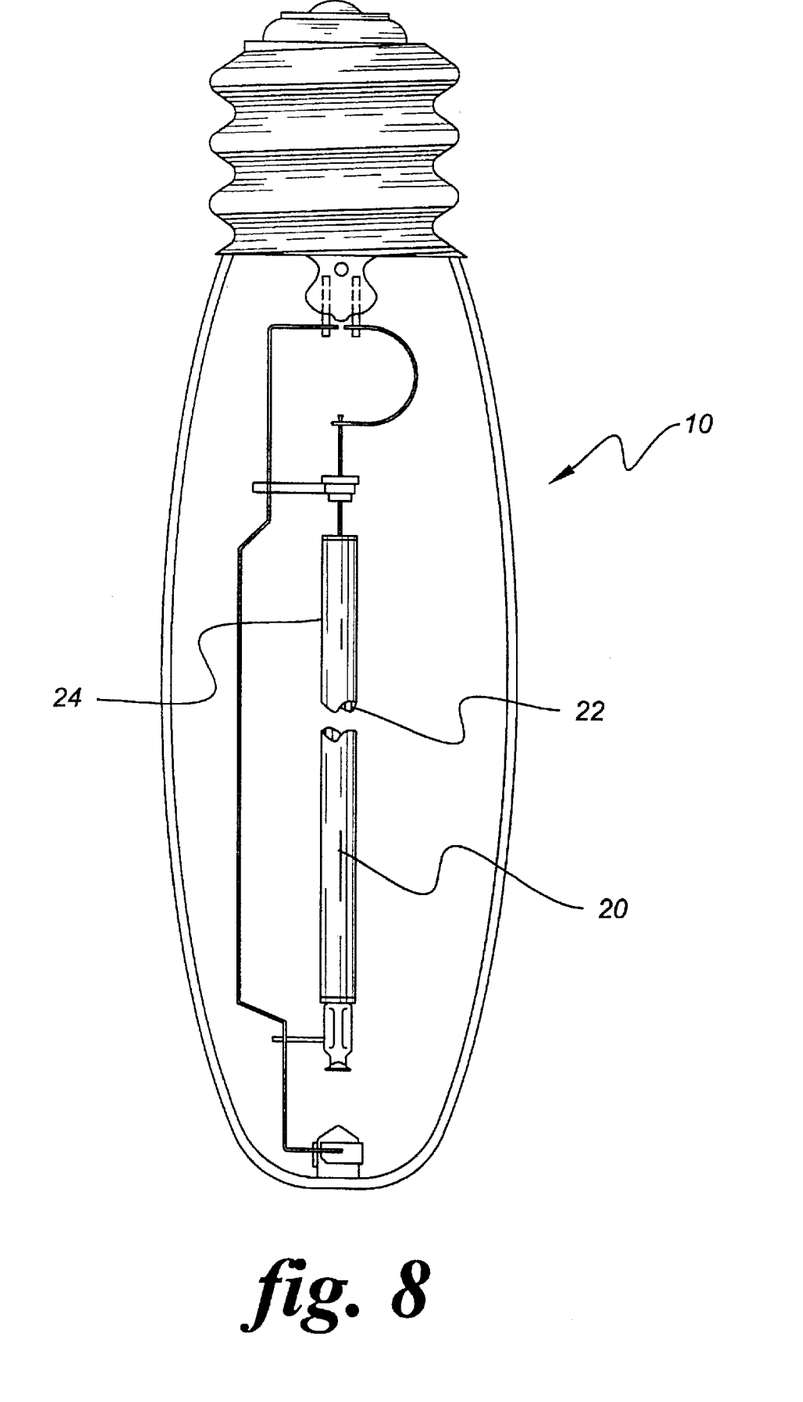
FIG. 8 is a schematic illustration of a high pressure sodium discharge lamp having an arc tube fabricated in accordance with a preferred aspect of the present invention.

Sapphire tubes produced according to the method of the preferred embodiment of the present invention may be adapted for use as arc tubes in HPS lamps. FIG. 8 illustrates an example of an HPS lamp 10 comprising the sapphire arc tube 20 fabricated by the method of the preferred embodiment of the present invention. Arc tube 20 is hollow, having an interior surface 22 and an exterior surface 24, and contains the high pressure sodium used for lamp operation. The total and forward diffuse visible light transmittance of the sapphire arc tube provides improved HPS lamp efficiency over that of PCA arc tubes of the prior art.

Further, the method according to the preferred aspects of the present invention enables tubes (or other shapes of objects) to be made that comprise a first portion having a single crystal structure and a second portion having a polycrystalline structure. Thus, it is possible to fabricate an arc tube 20 having an interior surface 22 comprising sapphire and an exterior surface 24 comprising polycrystalline alumina. One advantage of this tube structure is that the interior sapphire surface provides better resistance to sodium attack than does a polycrystalline surface, and the polycrystalline material on the outer surface of the tube provides good strength for the tube. However small micro-cracks, the size of the polycrystalline grains, can be present at the PCA/single crystal interface due to differential thermal contraction of the PCA grains adjacent to the surface crystal. Similarly, if desired, the arc tube can be fabricated so that interior surface 22 comprises polycrystalline alumina and exterior surface 24 comprises sapphire.

Sapphire produced according to the process of the preferred embodiment of the present invention is distinguished from sapphire fabricated using melt drawing techniques by the combination of a random pore cluster arrangements and a unique surface topography in the form of slight undulations having high points at approximately the midpoint of where each PCA grain was located prior to the conversion to sapphire and depressed areas corresponding to where the grain boundary grooves were located prior to conversion. By contrast, sapphire fabricated by many melt-drawing techniques typically exhibits a linear arrangement of porosity resulting from bubbles produced during the drawing process.

The following examples are merely illustrative, and should not be construed to be any sort of limitation on the scope of the claimed invention.

EXAMPLE 1

Two porous, bisque-fired Lucalox™ PCA tubes (as described above) were doped with molybdenum. Both tubes were about 220 mm long and had a 0.5 mm wall thickness. The first tube had an outside diameter of 5 mm and the second tube had an outside diameter of 8.8 mm.

The doping solution was prepared by dissolving 0.125 grams of molybdic acid in 2000 ml of deionized water, to provide a Mo concentration in the doping solution of about 5 ppm by weight. The doping solution provides a Mo doping ion concentration in the tubes of approximately 30 ppm by weight. Both porous PCA tubes described above were immersed in about 200 ml of the doping solution. The doping solution with the tubes immersed therein was then placed in a vacuum chamber. A vacuum of about 27 inches of Hg was drawn on the vacuum chamber and maintained for about 30 minutes, after which the doped bisque-fired alumina tubes were removed from the vacuum chamber and the doping solution and allowed to air dry. The resulting concentration of molybdenum dopant in the bisque-fired alumina tubes was predicted to be about 30 ppm by weight.

The doped, bisque-fired alumina was passed in a continuous manner through the hot zone of an electric resistance furnace having a temperature of about 1930° C. and an atmosphere of flowing dry hydrogen having a dew point of 10° C. for three hours.

Figure 1A:
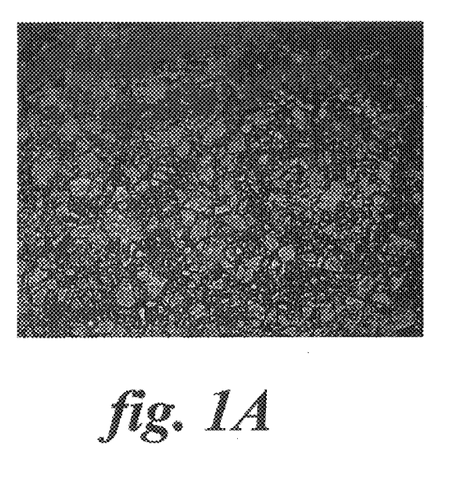
FIGS. 1A, 1B, 2A, 2B, 5, 6 and 7 are close-up, side views of the microstructure of single crystal sapphire according to preferred embodiments of the present invention.
Figure 1B:
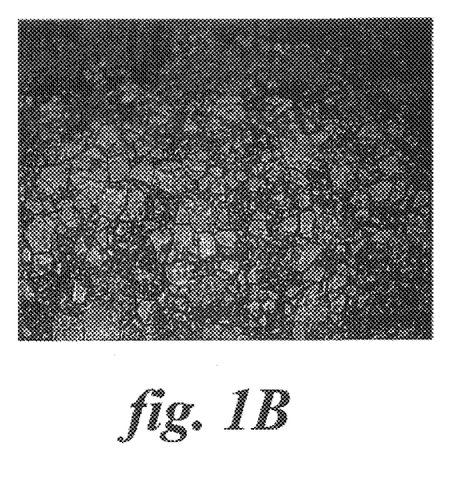

The micrographs of two regions of the 5 mm tube are shown in FIGS. 1A and 1B. FIG. 1A shows a surface grain structure in the unconverted polycrystalline matrix. FIG. 1B shows a surface microstructure where a large single crystal, in the top portion of the photo, is growing into a polycrystalline region, in lower portion of photo. The sapphire region illustrated in the upper portion of FIG. 1B contains a somewhat textured surface due to the slight undulations described above. The color of the tube was a translucent gray color.

EXAMPLE 2

Figure 2A:
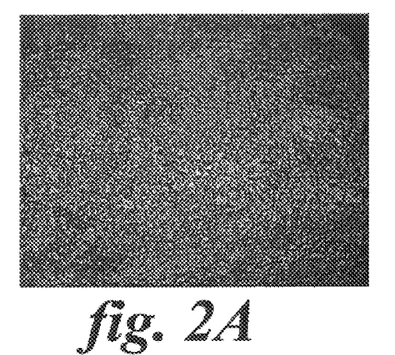
Figure 2B:
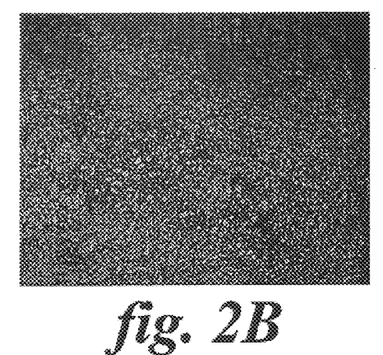

The experiment of Example 1 was repeated, except that the Mo concentration in the doping solution was increased to 11 ppm by weight, which results in a molybdenum concentration in the tubes of about 60 ppm. The micrographs of two regions of the 5 mm tube are shown in FIGS. 2A and 2B. As can be seen in the FIG. 2A, the alumina tube was converted to single crystal sapphire which exhibits less texture than the sapphire in FIG. 1B. FIG. 2B shows a large single crystal surrounding and consuming a more textured polycrystalline region. Thus, a larger single crystal with less texture (i.e., a smoother surface) was obtained by increasing the Mo concentration from 5 ppm to 11 ppm, as evidenced by the weak surface texture of the sapphire. The color of the sintered tube was a transparent dark gray color.

COMPARATIVE EXAMPLE 3

The experiments described in Example 1 were repeated, except the tubes were not doped with molybdenum. The undoped, bisque-fired alumina was passed in a continuous manner through the hot zone of an electric resistance furnace having a temperature of about 1930° C. and an atmosphere of flowing dry hydrogen having a dew point of 10° C. for three hours.

Figure 3:
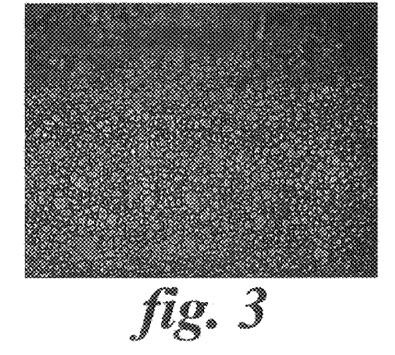
FIG. 3 is a close-up, side view of the microstructure of a prior art polycrystalline alumina.

The micrographs of one region of the 5 mm tube is shown in FIG. 3. As can be seen in the micrograph, the alumina tubes remained polycrystalline (heavily textured) and were not converted to single crystal sapphire. The alumina tubes were determined to contain <4 ppm Mo, <3 ppm Cr and <3 ppm Ga, which is the limit of detection of the ICP analytical equipment used.

COMPARATIVE EXAMPLE 4

In this comparative example, the molybdenum dopant was replaced with a chromium dopant according to U.S. Pat. No. 5,588,992. A doping solution was prepared by dissolving 0.918 grams of chromium (III) nitrate ($Cr(NO_3)_3$:$9H_2O$) in 1 liter of deionized water, which provides a Cr doping ion concentration of approximately 120 ppm by weight. Pieces of bisque-fired alumina tubing, described above, were immersed in about 400 ml of the doping solution. The doping solution with the bisque-fired alumina immersed therein was then placed in a vacuum chamber. A vacuum of about 27 inches of Hg was drawn on the vacuum chamber and maintained for about 30 minutes, after which the doped bisque-fired alumina tubes were removed from the vacuum chamber and the doping solution and allowed to air dry. The resulting concentration of chromium dopant in the bisque-fired alumina tubes was about 300 wppm.

The doped bisque-fired alumina was passed in a continuous manner through the hot zone of an electric resistance furnace having a temperature of about 1880° C. and an atmosphere of flowing dry hydrogen having a dew point of less than about 0° C. The 5 mm tube was 8% converted to sapphire after 3 hours in the furnace and 100% converted to sapphire after 9 hours in the furnace. The 8.8 mm tube was 5% converted to sapphire after 6 hours in the furnace and 100% converted to sapphire after 15 hours in the furnace.

EXAMPLE 5

Figure 4:
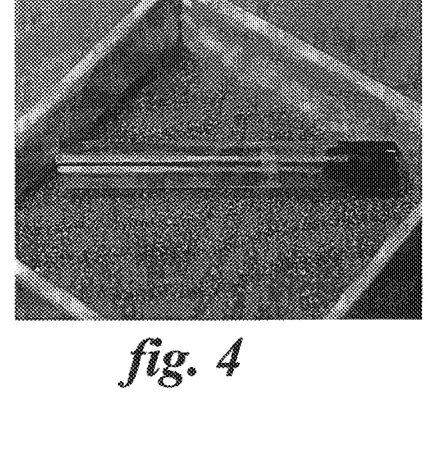
FIG. 4 is a side view of an alumina tube according to a preferred embodiment of the present invention.

One end of a 5 mm bisque fired PCA tube was dipped into a molybdic acid solution containing a Mo ion concentration of 150 ppm. The remaining experimental conditions, including the sintering process were the same as in Example 1. As shown in FIG. 4, the right end of the tube that was dipped into the molybdic acid solution turned dark gray/black.

Figure 5:
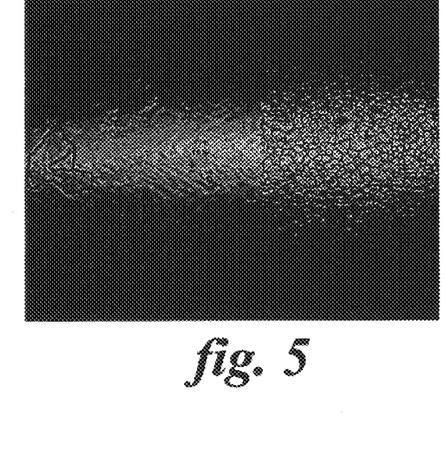

FIG. 5 illustrates a micrograph of a boundary region between the Mo dipped (left side) and the undipped (right side) portions. As can be seen from FIG. 5, the region dipped into the 150 ppm Mo solution was converted to a largely single crystal sapphire that substantially lacks texture (i.e. contains a substantially smooth surface). The dipped region contains only one small island containing 2 small crystals that have not yet been absorbed into the surrounding large single crystal. In contrast, the undipped portion remained polycrystalline. Therefore, a composite article may be produced by applying the Mo doping solution only to a portion of the article to be converted to sapphire. Furthermore, the high concentration Mo solution may be used in applications where it is desirable to obtain a sapphire article that lacks texture when the article is not required to be transparent.

EXAMPLE 6

Figure 6:
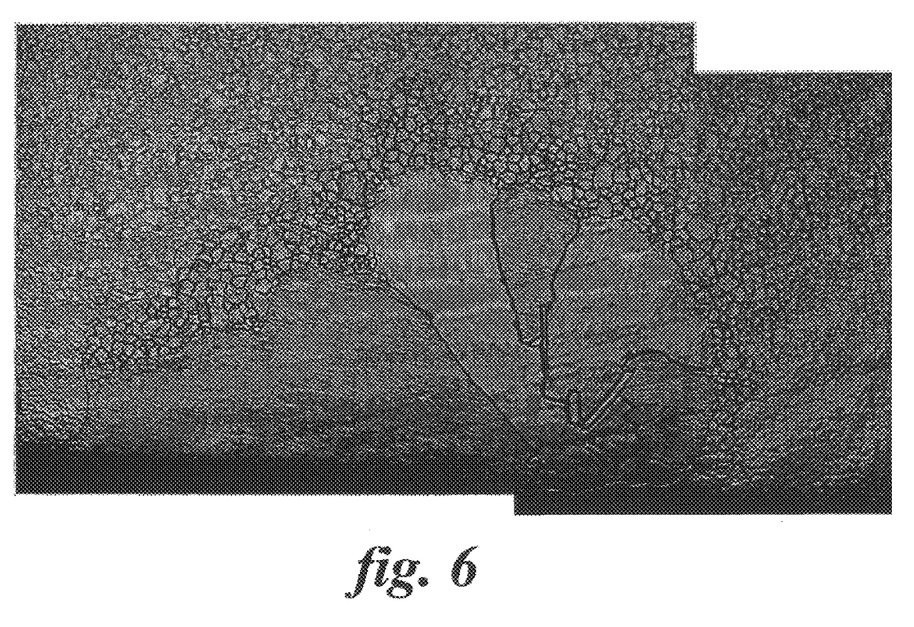

A 5 microliter drop of molybdic acid solution containing a Mo ion concentration of 150 ppm was placed on a portion of a 5 mm bisque-fired PCA tube. The tube was subsequently heated at the same conditions as described in example 1. FIG. 6 shows a micrograph of the doped region of the tube. The first portion doped with molybdenum was converted to four or five large single crystals (the lower/central area of FIG. 6). The second portion (i.e., top/edge area of FIG. 6) adjacent to the first portion was also converted to a single crystal structure, but having a rougher texture than the first portion. It appears that the Mo doped region acts as a seed or nucleation point for single crystal growth. Thus, it is possible to convert undoped polycrystalline regions that are located adjacent to the Mo doped regions to single crystal.

EXAMPLE 7

A 5 mm bisque-fired PCA tube was dipped into a commercially obtained doping solution containing tungsten and water. The doping solution provides a W concentration of about 10 ppm by weight. The doped tube was sintered at 1850° C. for 5 hours.

Figure 7:
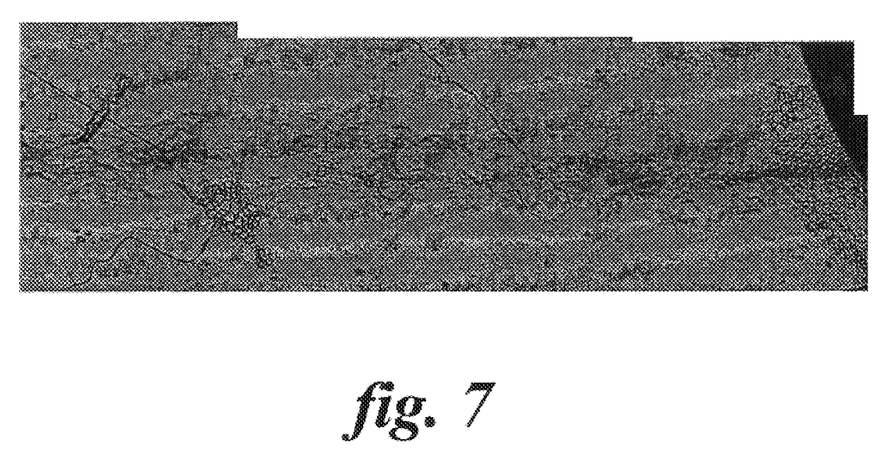

A micrograph of a region of the tube is shown in FIG. 7. As can be seen in FIG. 7, the tube was converted to single crystal sapphire with small polycrystalline regions visible in the lower left and center right portions of the micrograph. Two cracks between the sapphire single crystals are also visible in the center and left portions of the micrographs.

The 30 and 60 wppm Mo doped PCA tubes in Examples 1 and 2 were at least partially converted to sapphire after three hours. Likewise, the W doped PCA tube in Example 7 was almost entirely converted to sapphire after 5 hours. In contrast, the Cr doped PCA tubes in Comparative Example 4 were at least partially converted to sapphire after three hours by being doped with 300 wppm of Cr. Furthermore, the portions of the PCA tubes doped with Mo from a 150 ppm Mo solution in Examples 5 and 6 were substantially converted to sapphire (near 100% conversion) after 3 hours. In contrast, the PCA tubes doped with Cr from a solution containing 120 ppm Cr in Comparative Example 4 were 100% converted to sapphire after 9–15 hours.

Therefore, the Mo and W doped PCA tubes were converted to sapphire faster and with a lower dopant concentration than the Cr doped PCA tubes disclosed in U.S. Pat. No. 5,588.992. The improvement in conversion speed and dopant concentration achieved by using the Mo or W conversion-enhancing dopant also decreases the cost of the conversion process. Such a drastic improvement in conversion speed and dopant concentration is unexpected from the teaching of U.S. Pat. No. 5,588,992.

While particular embodiments of the present invention are described herein, it is understood that various other modifications will be apparent to and can be readily made by those skilled in the art without departing from the scope and spirit of the invention in its broader aspects. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

For example, suitable aluminas other than those used in the production of Lucalox™ PCA, such as bisque-fired aluminas, can be used in the practice of this invention. Such materials can be prepared, for example, from alumina powders in accordance with the known methods, with suitable selected dopants introduced at the bisque-fired stage. Examples of such known methods of processing alumina powders include the processes disclosed in U.S. Pat. Nos. 3,026,210 and 4,150,317, both of which are assigned to the assignee herein and incorporated by reference in their entirety. Alternatively, the dopant material can be introduced into the raw material used to produce the polycrystalline body in the same manner that magnesium is introduced into alumina in accordance with the procedures disclosed in U.S. Pat. Nos. 3,026,210 and 4,150,317, both of which are incorporated by reference.

Starting materials fabricated in either of the above manners, or other similarly efficacious manners apparent to those skilled in the art, should provide suitable starting materials for the process of the present invention, especially if the materials have comparable purity, density, grain size, and grain structure to the Lucalox™ PCA.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

What is claimed is:

1. A process for converting a polycrystalline ceramic material to a single crystal ceramic material, comprising:
   doping at least a first portion of the polycrystalline ceramic material with a conversion-enchancing dopant having a +6valence state in the ceramic material, the conversion-enhancing dopant comprising at least one of molybdenum and tungsten in a first concentration, wherein the first concentration is $\geq 30$ wppm; and
   heating the polycrystalline ceramic material to convert at least a second portion of the polycrystalline ceramic material to a single crystal ceramic material.

2. The process of claim 1, wherein:
   the polycrystalline ceramic material comprises alumina; and
   the single crystal ceramic material comprises sapphire.

3. The process of claim 2, wherein the conversion-enhancing dopant comprises molybdenum in a first concentration sufficient to enhance the conversion of polycrystalline alumina to sapphire.

4. The process of claim 1 wherein the first concentration is $\geq 30$ wppm but $\leq 60$ wppm.

5. The process of claim 2, wherein the conversion-enhancing dopant comprises tungsten in a first concentration sufficient to enhance the conversion of polycrystalline alumina to sapphire.

6. The process of claim 1, wherein the step of doping the polycrystalline ceramic material comprises doping a bisque-fired alumina precursor of a polycrystalline ceramic alumina material with the conversion-enhancing dopant to a first concentration sufficient to enhance the conversion of the polycrystalline ceramic alumina material to the single crystal sapphire ceramic material.

7. The process of claim 6, wherein the step of doping the bisque-fired precursor comprises:
   immersing a bisque-fired precursor of alumina in a liquid solution containing a second concentration of molybdenum; and
   allowing the molybdenum to penetrate into the bisque-fired precursor of alumina to the first concentration.

8. The process of claim 7, wherein the first concentration comprises at least 30 wppm by weight and the second concentration comprises at least 5 wppm.

9. The process of claim 8, wherein the first concentration comprises 30–60 wppm and the second concentration comprises 5–11 wppm.

10. The process of claim 1, wherein the step of doping the polycrystalline ceramic material comprises the steps of:
   doping a starting powder with said conversion-enhancing dopant to a first concentration sufficient to enhance the conversion of the polycrystalline ceramic material to the single crystal ceramic material; and
   processing the starting powder to form said polycrystalline ceramic material.

11. The process of claim 1, wherein the step of doping the polycrystalline ceramic material comprises dispersing the conversion-enhancing dopant homogeneously throughout the entire polycrystalline ceramic material.

12. The process of claim 1, wherein the step of heating said doped polycrystalline ceramic material comprises heating the polycrystalline ceramic material to a temperature above one-half of its melting temperature but below its melting temperature.

13. The process of claim 12, wherein the step of heating said doped polycrystalline ceramic material comprises the substeps of:
   a first heating substep to form a sintered polycrystalline ceramic material body;
   a second heating substep to remove a portion of a conversion-impeding additive from the sintered polycrystalline ceramic material body; and
   a third heating substep to convert the sintered polycrystalline ceramic material body to a single crystal ceramic material body.

14. The process of claim 13, wherein the first, second and third heating substeps comprise separate heating cycles.

15. The process of claim 13, wherein the first, second and third heating substeps comprise a single continuous heating cycle.

16. The process of claim 1, wherein the step of doping at least a first portion of said polycrystalline ceramic material comprises doping the first portion and not doping a third portion of said polycrystalline ceramic material such that the step of heating said polycrystalline ceramic material produces a composite body comprising a single crystal structure in a second portion of the material and a polycrystalline structure in the third portion; and
   wherein the second portion contains at least the first portion.

17. The process of claim 1, wherein said single crystal ceramic material comprises at least a portion of a fiber, a substrate or a high intensity discharge lamp tube.

18. A process for converting polycrystalline alumina to sapphire, comprising:
   immersing at least a first portion of a polycrystalline bisque-fired alumina body containing at least 150 wppm of magnesium oxide in a liquid solution containing molybdenum or tungsten in a concentration equal to or greater than 5 wppm and allowing the molybdenum or tungsten to penetrate into said alumina body;
   sintering the alumina body;
   decreasing the concentration of magnesium oxide in the sintered alumina body to a concentration of 60 wppm or less; and
   heating the sintered alumina body to a temperature above one-half of a melting temperature of alumina but below the melting temperature of alumina to convert at least the first portion of the sintered alumina body to single crystal sapphire.

19. A ceramic material body comprising at least a first single crystal sapphire portion containing a first concentration of molybdenum or tungsten sufficient to enhance a conversion of polycrystalline alumina to the single crystal sapphire wherein the first concentration comprises at least 30 wppm.

20. The body of claim 19, wherein the first concentration comprises 30 to 60 wppm of molybdenum.

21. The body of claim 20, made by the steps of:
   immersing at least a first portion of a polycrystalline bisque-fired alumina body containing at least 150 wppm of magnesium oxide in a liquid solution containing molybdenum or tungsten in a concentration equal to or greater than 5 wppm and allowing the molybdenum or tungsten to penetrate into said alumina body;
   sintering the alumina;
   decreasing the concentration of magnesium oxide in the sintered alumina body to a concentration of 60 wppm or less; and
   heating the sintered alumina body to a temperature above one-half of a melting temperature but below the melting temperature of alumina to convert at least the first portion of the sintered alumina body to single crystal sapphire.

22. The body of claim 19, comprising single crystal sapphire in the first portion and polycrystalline alumina in a second portion.

23. The body of claim 19, wherein the entire body comprises single crystal sapphire containing the first concentration of molybdenum or tungsten sufficient to enhance the conversion of polycrystalline alumina to the single crystal sapphire.

24. A high pressure sodium lamp containing an arc tube comprising the ceramic material body of claim 19.

25. A high pressure sodium lamp containing an arc tube comprising the ceramic material body of claim 21.

26. A fiber or a substrate comprising the ceramic material body of claim 19.

* * * * *